United States Patent
Yee et al.

(10) Patent No.: US 10,096,534 B2
(45) Date of Patent: Oct. 9, 2018

(54) THERMAL PERFORMANCE OF LOGIC CHIP IN A PACKAGE-ON-PACKAGE STRUCTURE

(71) Applicant: NVIDIA CORPORATION, Santa Clara, CA (US)

(72) Inventors: Abraham F. Yee, Cupertino, CA (US); Jayprakash Chipalkatti, Cupertino, CA (US); Shantanu Kalchuri, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 13/673,592

(22) Filed: Nov. 9, 2012

(65) Prior Publication Data

US 2014/0131847 A1    May 15, 2014

(51) Int. Cl.
  *H01L 23/02*   (2006.01)
  *H01L 23/36*   (2006.01)
  (Continued)

(52) U.S. Cl.
  CPC .......... *H01L 23/36* (2013.01); *H01L 23/3677* (2013.01); *H01L 23/49827* (2013.01); *H01L 25/105* (2013.01); *H05K 1/0209* (2013.01); *H01L 23/49816* (2013.01); *H01L 2224/16225* (2013.01); *H01L 2224/32225* (2013.01); *H01L 2224/48091* (2013.01); *H01L 2224/73204* (2013.01); *H01L 2224/73265* (2013.01);
  (Continued)

(58) Field of Classification Search
  CPC ... H01L 23/36; H01L 23/49827; H01L 25/117

USPC .......... 257/706, 713, 686, E23.101
See application file for complete search history.

(56) References Cited

U.S. PATENT DOCUMENTS 5,216,278 A   6/1993  Lin et al.
5,834,848 A * 11/1998  Iwasaki .............. H01L 21/563
                                                 257/778
(Continued)

FOREIGN PATENT DOCUMENTS

DE    102011012186 A1    8/2012

OTHER PUBLICATIONS

Micron, CSP-34: Pop User Guise, Customer Service Note, 201, 14 pages.

*Primary Examiner* — Nitin Parekh
(74) *Attorney, Agent, or Firm* — Artegis Law Group, LLP

(57) ABSTRACT

Embodiments of the invention provides an IC system in which low-power chips can be positioned vertically proximate high-power chips without suffering the effects of overheating. In one embodiment, the IC system includes a first substrate, a high-power chip disposed on a first side of the first substrate, a thermal conductive pad disposed on a second side of the first substrate, one or more thermal conductive features formed in the first substrate, wherein the thermal conductive features thermally connect the high-power chip and the thermal conductive pad, and a heat sink attached to a surface of the thermal conductive pad, wherein the heat sink is in thermal communication with the thermal conductive pad. By having thermal conductive features formed through the first substrate to thermally connect the high-power chip and the thermal conductive pad, heat generated by the high-power chip can be effectively dissipated into the heat sink.

20 Claims, 1 Drawing Sheet

(51) Int. Cl.
  *H01L 23/367* (2006.01)
  *H01L 25/10* (2006.01)
  H01L 23/498 (2006.01)
  H05K 1/02 (2006.01)

(52) U.S. Cl.
  CPC ........... *H01L 2225/1023* (2013.01); *H01L 2225/1058* (2013.01); *H01L 2924/15311* (2013.01); *H05K 1/0206* (2013.01); *H05K 2201/10553* (2013.01)

(56) References Cited

U.S. PATENT DOCUMENTS

| | | | |
|---|---|---|---|
| 6,265,771 B1* | 7/2001 | Ference et al. | 257/706 |
| 6,265,772 B1* | 7/2001 | Yoshida | 257/712 |
| 6,459,039 B1* | 10/2002 | Bezama | H01L 23/49827 174/255 |
| 6,514,792 B2* | 2/2003 | Katchmar | 438/107 |
| 7,161,239 B2* | 1/2007 | Zhao | H01L 23/24 257/706 |
| 7,274,105 B2* | 9/2007 | Fairchild | H01L 23/3677 174/255 |
| 7,948,076 B2* | 5/2011 | Wang | H01L 23/3677 257/707 |
| 7,989,947 B2* | 8/2011 | Otani | H01L 21/565 257/706 |
| 2002/0190362 A1 | 12/2002 | Khan et al. | |
| 2006/0237225 A1 | 10/2006 | Kariya et al. | |
| 2008/0211079 A1 | 9/2008 | Onodera | |
| 2011/0037157 A1* | 2/2011 | Shin et al. | 257/686 |

* cited by examiner

THERMAL PERFORMANCE OF LOGIC CHIP IN A PACKAGE-ON-PACKAGE STRUCTURE

BACKGROUND OF THE INVENTION

Field of the Invention

Embodiments of the present invention generally relate to integrated circuit chip packaging and, more specifically, to a package-on-package (POP) packaging system with a high power chip and a low power chip.

Description of the Related Art

With the development of the electronics industry, there are increasing demands for smaller electronic devices with improved performance. In order to achieve a higher integration density and a smaller footprint of electronic components, a so-called "package-on-package (POP)" technology has been developed. POP is a three-dimensional packaging technology used to vertically stack a plurality of leadframe-based semiconductor packages atop each other with an interface to route signals between them.

Minimizing the thickness of the package has been a challenge to the successful implementation of the POP technology since there is generally a trade-off between the thermal management of chips and other devices contained in the package and the performance of the devices. Specifically, by locating memory chips, passive devices, and other low-power components of an IC package as close as possible to the central processor unit (CPU) and other high-power devices in an IC package, communication between devices in the IC package is accelerated and packaging parasitics are reduced. However, heat generated by higher-power chips is known to adversely affect memory chips and other devices positioned nearby. Consequently, it is not thermally feasible to stack memory chips and passive devices directly on or under a CPU or other high-power chip when incorporated into a single IC package, since such a configuration necessarily limits the power of the high-power chip or affects the performance of the memory chips.

As the foregoing illustrates, there is a need in the art for a package system having a greater density of integrated circuits with a corresponding reduction in package size. More particularly, there is a need for a high-power chip and a low-power chip arrangement in a vertical stack which prevents heat transfer between the chips.

SUMMARY OF THE INVENTION

Embodiments of the present invention set forth an IC system in which one or more low-power chips can be positioned proximate high-power chips without suffering the effects of overheating. In one embodiment, the IC system includes a high-power chip mounted on a first packaging substrate, and a low-power chip disposed on a second packaging substrate which is positioned above the first packaging substrate to form a stack. A thermal conductive pad is attached to a bottom surface of the first packaging substrate, and is in thermal communication with a portion of a printed circuit board positioned below the first packaging substrate. A plurality of thermal conductive features are formed through the first packaging substrate to thermally connect the high-power chip and the heat conductive pad.

One advantage of the present invention is that a memory chip or other low-power chip can be positioned in close proximity to a high-power chip that is mounted on a packaging substrate in the same IC system without being overheated by the high-power chip. By having thermal conductive features formed through the first packaging substrate to thermally connect the high-power chip and a thermal conductive pad that is positioned between (and in thermal communication with) the first packaging substrate and the printed circuit board, heat generated by the high-power chip can be effectively dissipated into the printed circuit board, which serves as a heat sink for the IC system. In this manner, the lifetime of the low-power chip is extended.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
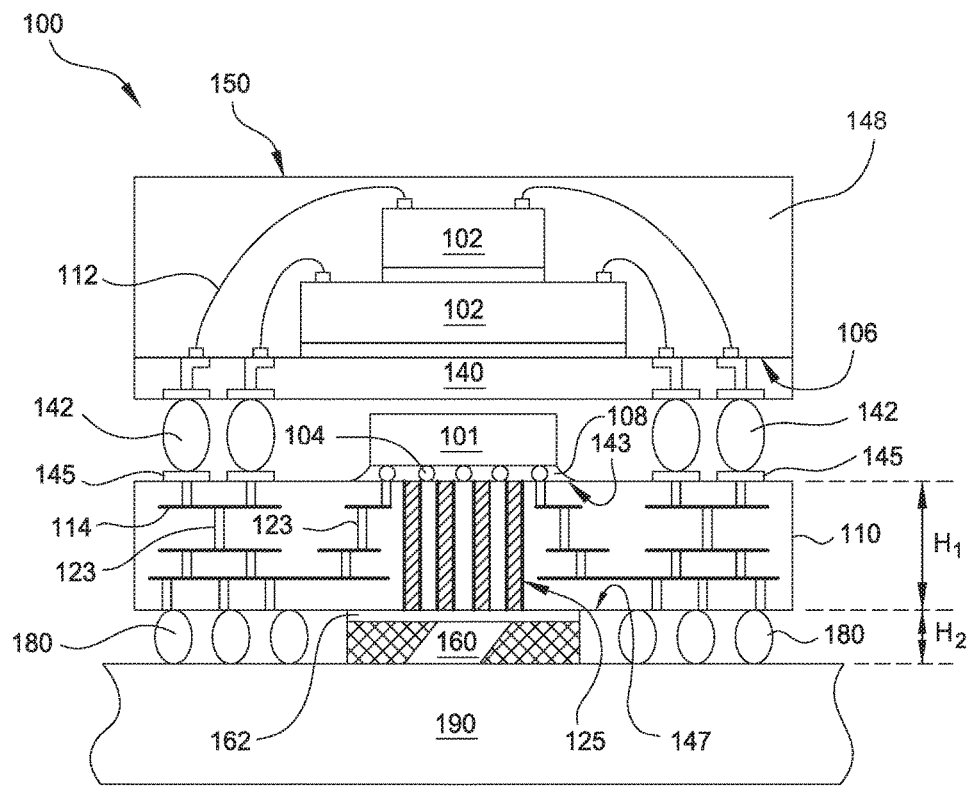
FIG. 1 is a schematic cross-sectional view of an integrated circuit (IC) system, according to one embodiment of the invention.

FIG. 1 is a schematic cross-sectional view of an integrated circuit (IC) system 100, according to one embodiment of the invention. The IC system 100 generally includes multiple IC chips and/or other discrete microelectronic components, and is configured to electrically and mechanically connect said chips and components to a printed circuit board 190. The IC system may be a vertical combination, i.e., a stacked configuration, of one or more high-power chips 101 and one or more low-power chips 102. In this disclosure, the high-power chip 101 may be a high-power processor, such as a central processing unit (CPU), a graphics processing unit (GPU), application processor or other logic device, or any IC chip capable of generating enough heat during operation to adversely affect the performance of low-power chip 101 or passive devices located in the IC system 100. For example, a high-power chip is typically one that generates at least 10 W of heat or more during normal operation. Conversely, a low-power chip is one that does not generate enough heat during operation to adversely affect the performance of adjacent IC chips or devices. For example, a low-power chip is any IC chip that generates on the order of about 1 W of heat, i.e., no more than about 5 W, during normal operation. Low-power chips may be passive devices located in the IC system 100, for example a memory device, such as RAM or flash memory, an I/O chip, or any other chip that does not generate over 5 W in normal operation.

In the embodiment shown in FIG. 1, the IC system 100 includes a high-power chip 101 disposed on a top surface 143 of a first packaging substrate 110 and a pack of low-power chips 102 disposed on a top surface 106 of a second packaging substrate 140. The first packaging substrate 110 is substantially parallel to and opposing the second packaging substrate 140, with the high-power chip 101 sandwiched between the first packaging substrate 110 and the second packaging substrate 140. The second packaging substrate 140 is disposed over a top surface 143 of the first packaging substrate 110 and is electrically connected to the first packaging substrate 110 through electrical connections 142. The electrical connections 142 between the second packaging substrate 140 and the first packaging substrate 110 may be made using any technically feasible approach known in the art, such as a solder bump or a solder ball. The electrical connections 142 may be in physical contact with corresponding bond pads 145 formed on the top surface 143 of the first packaging substrate 110. It is contemplated that the electrical communication between the second packaging substrate 140 and the first packaging substrate 110 may also be made by other bonding techniques, such as a flip-chip bonding technique or a pin grid array (PGA) technique.

The low-power chip 102 mounted on the second packaging substrate 140 may be encapsulated in a molding material 148 to protect the chip 102. The high-power chip 101 is in electrical communication with the first packaging substrate 110 through electrical connections 104, such as microbumps. If desired, reliability of electrical connections 104 may be improved by protecting the electrical connections 104 with an encapsulant material 108. The molding or encapsulant material may be a resin, such as epoxy resin, acrylic resin, silicone resin, polyurethane resin, polyamide resin, polyimide resin, etc. Any other technically feasible packaging techniques may be used to protect the low-power chip 102 or electrical connections 104 of the high-power chip 101 to the first packaging substrate 110. While not shown, it is contemplated that the top side 150 of the molding material 148 facing away from the second packaging substrate 140 may be attached to a heat sink or other cooling mechanism to enhance the thermal transmittance of the IC system 100.

The low-power chip 102 is mounted opposite the high-power chip 101 in a stacked configuration, and is electrically connected to the high-power chip 101 and the PCB 190 via conductive traces 114 and conductive vias 123 formed in the first packaging substrate 110. The electrical connection between the high-power chip 101 and the first packaging substrate 110 may be made using any technically feasible approach known in the art. It is noted that conductive traces 114 and conductive vias 123, and configuration thereof, are exemplary approaches that can be used to electrically connect the high-power chip 101 to external components. Any known electrical connection with a different routing arrangement/configuration may be used in lieu of or in addition to the use of conductive traces 114 and conductive vias 123.

In the embodiment illustrated in FIG. 1, a thermal conductive pad 160 is attached to a bottom surface 147 of the first packaging substrate 110. The thermal conductive pad 160 and the thermal conductive features 125 to be discussed below are configured to facilitate heat flow from the high-power chip 101 to the PCB 190. The thermal conductive pad 160 may be secured to the first packaging substrate 110 through an adhesive layer 162. The adhesive layer 162 may be a metal-adhesive layer comprising at least one of TiN, Cu, Ni, Ag, Ti, Ta, W, TiN, WN, TiW, or any suitable material such as thermally-conductive epoxy resin. The thermal conductive pad 160 may be made of a metal such as copper, aluminum, gold, silver, iron, alloys of two or more elements, polymer, or stainless steel. In one example, the thermal conductive pad 160 is made of copper.

The thermal conductive pad 160 may be disposed at the central region on the bottom surface 147 of the first packaging substrate 110. The location of the thermal conductive pad 160 may be adjusted in accordance with the thermal conductive features 125. The thermal conductive pad 160 may occupy a surface area about 10% to about 100% of the first packaging substrate 110. In one example, the thermal conductive pad 160 covers about 20% to about 60% surface area of the first packaging substrate 110. It may be advantageous in certain embodiments to make the thermal conductive pad 160 electrically conductive so that it can serve as an electrical connection between the first packaging substrate 110 and the PCB 190. In other words, the thermal conductive pad 160 can replace some of the solder balls 180 mounted to the bottom surface 147 of the first packaging substrate 110 that are used for electrically connecting the first packaging substrate 110 to the PCB 190.

Figure 2:
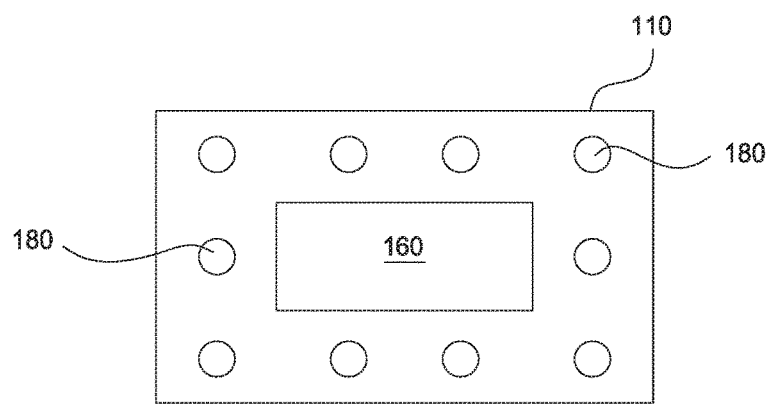
FIG. 2 is a schematic bottom view of a first packaging substrate showing an exemplary arrangement of a thermal conductive pad with respect to solder balls.

FIG. 2 is a schematic bottom view of the first packaging substrate 110 showing an exemplary arrangement of the thermal conductive pad 160 with respect to the solder balls 180. It is contemplated that the thermal conductive pad 160 may vary in size depending upon the need for heat dissipation and/or electrical connection of the IC system 100.

The first packaging substrate 110 may include one or more thermal conductive features 125 embedded or formed therein for the purpose of heat transfer. The thermal conductive features 125 are configured to conduct heat generated by the high-power chip 101 towards the PCB 190, which serves as a heat sink for the IC system 100. The thermal conductive features 125 may be parallel to each other at any desired interval. In the embodiment of FIG. 1 as shown, the thermal conductive features 125 are vias running vertically through the first packaging substrate 110. It is contemplated that the thermal conductive features 125 may be any known structure in the art and may be in any suitable arrangement, as long as the heat generated by the high-power chip 101 can be effectively transmitted through the first packaging substrate 110 to the thermal conductive pad 160 that is attached to the PCB 190. In cases where the thermal conductive features 125 are vias, they may be formed by laser drilling and filled with a thermal media such as copper. Any other suitable technique may be used to form thermal conductive features 125. The thermal conductive features 125 may be formed and arranged in a way not interfering with the electrical traces 114 or conductive vias 123, or any other features in the first packaging substrate 110. While four thermal conductive features 125 are shown, it is understood that any number of the thermal conductive features 125 may be used.

In various embodiments, the thermal conductive features 125 may have a height "$H_1$" of about 200 μm to about 600 μm, for example about 400 μm. The thermal conductive pad 160 and the adhesive layer 162 may have a height "$H_2$" of about 50 μm to about 250 μm, for example about 150 μm.

The thermal conductive features 125 thermally connect the high-power chip 101 and the thermal conductive pad 160. Therefore, heat generated by the high-power chip 101 is dissipated down through the first packaging substrate 110 to the thermal conductive pad 160 and then to the PCB 190, rather than adversely affecting the low-power chip 102 that is positioned above the high-power chip 101. If desired, some or all of the thermal conductive features may be made electrically conductive so that they can be used to provide power and/or ground signals directly from the PCB to the high-power chip 101. In such a case, the thermal conductive features may comprise copper, aluminum, gold, silver, or alloys of two or more electrical conductive elements.

It is contemplated that embodiments of the invention may be devised without departing from the basic scope thereof.

For example, instead of mounting the high-power chip 101 on the top surface 143 of the first packaging substrate 110, the high-power chip 101 may be embedded within the first packaging substrate 110, with the thermal conductive features 125 and the thermal conductive pad 160 configured in a similar way as discussed above to facilitate heat flow to the PCB 190.

The first packaging substrate 110 provides the IC system 100 with structural rigidity and an electrical interface for routing input and output signals as well as power between the high-power chip 101, the low-power chip 102, and the PCB 190. While not shown, it is contemplated that the first packaging substrate 110 may be a laminate substrate comprised of a stack of insulative layers. The conductive traces 114 and the conductive vias 123, as discussed above, may be formed between the insulative layers to provide electrical communication between the high-power chip 101, the low-power chip 102, and the PCB 190.

Suitable materials that may be used to make the first packaging substrate 110 and the second packaging substrate 140 include, but are not limited to FR-2 and FR-4, which are traditional epoxy-based laminates, and resin-based Bismaleimide-Triazine (BT) from Mitsubishi Gas and Chemical. FR-2 is a synthetic resin bonded paper having a thermal conductivity in the range of about 0.2 W/(K-m). FR-4 is a woven fiberglass cloth with an epoxy resin binder that has a thermal conductivity in the range of about 0.35 W/(K-m). BT/epoxy laminate packaging substrates also have a thermal conductivity in the range of about 0.35 W/(K-m). Other suitably rigid, electrically isolating, and thermally insulating materials that have a thermal conductivity of less than about 0.5 W/(K-m) may also be used.

In sum, embodiments of the invention set forth an IC system in which one or more low-power chips are vertically positioned above one or more high-power chips mounted on a packaging substrate proximate the low-power chips in the same IC system without suffering the effects of overheating. By having thermal conductive features formed through the packaging substrate and thermally connected to a thermal conductive pad attached to the bottom surface of the packaging substrate, the heat generated by the high-power chips can be effectively dissipated into a PCB, which is in thermal communication with the thermal conductive pad and serves as a heat sink for the IC system. Therefore, heat transfer from the high-power chips to the low-power chips is prevented or minimized. As a result, the lifetime of the memory chip is extended.

While the foregoing is directed to embodiments of the present invention, other and further embodiments of the invention may be devised without departing from the basic scope thereof, and the scope thereof is determined by the claims that follow.

We claim:

1. An integrated circuit system, comprising:
 a first packaging substrate having a first side and a second side;
 a first chip disposed on the first side of the first packaging substrate;
 a thermal conductive pad disposed on the second side of the first packaging substrate;
 one or more first thermal conductive features formed in the first packaging substrate that are disposed beneath the first chip, run vertically through the entirety of the first packaging substrate, and thermally couple the first chip and the thermal conductive pad;
 a heat sink attached to a surface of the thermal conductive pad, wherein the heat sink comprises a printed circuit board that contacts the thermal conductive pad;
 a second packaging substrate having a first side and a second side, wherein the second side of the second packaging substrate faces the first side of the first packing substrate, and the first chip is disposed on the second side of the second packing substrate; and
 a second chip disposed on the first side of the second packaging substrate,
 wherein the second packaging substrate has first conductive features formed therein that comprise part of an electrical connection between the second chip and the printed circuit board,
 wherein an air gap exists between an entirety of a first side of the first chip and the second side of the second packing substrate, and
 wherein the first side of the first chip faces the second side of the second packaging substrate.

2. The system of claim 1, wherein the second chip, the first chip, and the printed circuit board are in electrical communication with each other.

3. The system of claim 1, wherein the thermal conductive pad is positioned at a central region of the first packaging substrate.

4. The system of claim 1, wherein the thermal conductive pad occupies a surface area about 10% to about 100% of the first packaging substrate.

5. The system of claim 4, wherein the thermal conductive pad occupies the surface area about 20% to about 60% of the first packaging substrate.

6. The system of claim 1, wherein the thermal conductive pad is electrically conductive.

7. The system of claim 1, wherein the thermal conductive pad comprises copper, aluminum, gold, silver, iron, alloys of two or more elements, polymer, or stainless steel.

8. The system of claim 7, wherein the thermal conductive pad comprises copper.

9. The system of claim 1, wherein the one or more first thermal conductive features comprise vias that run vertically through the first packaging substrate.

10. The system of claim 1, wherein the one or more first thermal conductive features are electrically conductive.

11. The system of claim 1, wherein the first chip generates more heat during normal operation than the second chip generates during normal operation.

12. The system of claim 1, further comprising a third chip disposed on the first side of the second packaging substrate.

13. The system of claim 1, wherein the first side of the first chip is not physically connected to the second side of the second packaging substrate because of the air gap.

14. The system of claim 1, wherein the second packing substrate does not have any of the first thermal conductive features formed therein.

15. The system of claim 1, wherein the one or more first thermal conductive features do not comprise any part of an electrical connection between the first chip and the printed circuit board.

16. An integrated circuit system, comprising:
 a first packaging substrate, the first packaging substrate having a first side and a second side parallel to the first side;
 a first chip embedded within the first packaging substrate;
 a thermal conductive pad disposed on the second side of the first packaging substrate;
 one or more first thermal conductive features formed in the first packaging substrate that are disposed beneath the first chip, run vertically through the entirety of the first packaging substrate, and thermally couple the first chip and the thermal conductive pad; and a heat sink attached to a surface of the thermal conductive pad, wherein the heat sink comprises a printed circuit board that contacts the thermal conductive pad;

a second packaging substrate having a first side and a second side, wherein the second side of the second packaging substrate faces the first side of the first packing substrate, and the first chip is disposed on the second side of the second packing substrate; and a second chip disposed on the first side of the second packaging substrate, wherein the second packaging substrate has first conductive features formed therein that comprise part of an electrical connection between the second chip and the printed circuit board, wherein an air gap exists between an entirety of a first side of the first chip and the second side of the second packing substrate, and wherein the first side of the first chip faces the second side of the second packaging substrate.

17. The system of claim 16, wherein the first chip generates more heat during normal operation than the second chip generates during normal operation.

18. The system of claim 16, wherein the thermal conductive pad is electrically conductive.

19. The system of claim 16, wherein the one or more first thermal conductive features comprise vias that run vertically through the first packaging substrate.

20. The system of claim 16, wherein the heat sink is in electrical communication with the thermal conductive pad.

* * * * *